United States Patent [19]
Ang

[11] Patent Number: 5,968,193
[45] Date of Patent: Oct. 19, 1999

[54] DUAL SITE LOADBOARD TESTER

[75] Inventor: Hee Lai Ang, Penang, Malaysia

[73] Assignee: Integrated Device Technology, Inc., Santa Clara, Calif.

[21] Appl. No.: 08/864,524

[22] Filed: May 27, 1997

[30] Foreign Application Priority Data

Nov. 15, 1996 [MY] Malaysia ............................ PI-960-4737

[51] Int. Cl.⁶ .................................................. H04B 17/00
[52] U.S. Cl. ............................................................ 714/724
[58] Field of Search .................................. 371/22.1, 22.6; 714/724, 734

[56] References Cited

U.S. PATENT DOCUMENTS 5,172,377  12/1992  Robinson et al. ..................... 371/22.3

Primary Examiner—Phung M. Chung
Attorney, Agent, or Firm—Skjerven, Morrill, MacPherson, Franklin & Friel

[57] ABSTRACT

A method and apparatus for testing integrated circuit devices includes a dual site loadboard (60) with dual test sites (62) for holding integrated circuit devices. The dual test sites are connected to test instruments. Integrated circuit devices are loaded onto the dual test sites and tested one at a time using the same set of pin cards (34) in a test head (30).

13 Claims, 4 Drawing Sheets

MOTHER BOARD DUAL SITES SWITCHING PER PIN

TO TESTER PIN CARD FORCE AND SENSE ←————————→ TO SITE 1 SOCKET

ORIGINAL MOTHER BOARD

DUAL SITE LOADBOARD TESTER

BACKGROUND OF THE INVENTION

1. Field of the Invention

This invention relates to the testing of integrated circuits, and in particular, to a method and apparatus for testing integrated circuits in an efficient manner.

2. Discussion of the Related Art

Due to improper manufacturing, integrated circuits (ICs) are subject to a variety of failure modes. Therefore, proper testing of ICs during and after fabrication is important to improving the reliability and yield of product shipped to customers. However, the costs associated with testing ICs are growing rapidly.

Overall cost is a significant factor in the success of integrated circuit products. Testing ICs is a relatively time-consuming and expensive process. Therefore, it is desirable to keep testing costs low by minimizing test throughput times.

Even though many techniques and software tools are becoming available to increase design productivity, test productivity lags far behind. Poor test productivity means that the design cycle may soon be dominated by the testing activities. In addition, the complexity of ICs requires relatively expensive testing equipment.

As electronic technology improved, testers became faster than the handlers which supplied them. The time required for testing ICs continues to decline. As a result, testers often operate only a fraction of their test time capability because the handler is unable to deliver and transport ICs to the tester as fast as the tester is able to evaluate them. This results in inefficient use of the tester as the tester remains idle while the handler transports ICs.

For example, FIG. 1 illustrates a prior art device testing station 10. Device testing station 10 includes test instruments for testing ICs. Such device testing stations are available on the open market as known in the art, and can be, for example, the MCT 2010 tester. Other models are available from the same manufacturer and other manufacturers, and are suited for use with the present invention as will become apparent to those skilled in the art.

Referring to FIG. 1, in its normal configuration, as provided by the manufacturer, device testing station 10 includes a controller 16, a keyboard 18, a power supply 20, an auxiliary blower 22, a test head 14, and a single site loadboard 12. The test head 14 is designed to interface with other test equipment such as a device handler (not shown). The power supply 20 and the controller 16 are connected to test head 14 by a hose assembly 26 that transfers cooling air, digital signals, and power between them. As a complete device testing station, controller 16, keyboard 18, power supply 20, and auxiliary blower 22, are in a vertical rack-mount cabinet 28. Test head 14 is supported by a test head stand 24.

Single site loadboard 12 interfaces with test head 14. Single site loadboard 12 provides a single test site 13 for testing a device. Therefore, device testing station 10 can only be used for single site testing. Single site testing represents a very inefficient use of an expensive device testing station.

However, modifying a tester so that it is capable of testing multiple high pin count devices is an expensive undertaking. For example, testers such as the MCT 2010 provide up to 64 pin electronics cards (pin cards). Testing ICs requires that each device pin be assigned to one pin card. As a result, testing an IC with 56 pins requires 56 pin cards. Therefore, in order to test two ICs each with 56 pins without incurring all of the time delay associated with unloading the first IC and loading the second IC would require a tester with at least 112 pin cards and, as a result, would require the addition of complex and expensive equipment.

Accordingly, it would be desirable to provide a method and apparatus for testing ICs that maximizes the use of a tester without requiring additional complex and expensive equipment.

SUMMARY OF THE INVENTION

The present invention provides a method and apparatus for economically and efficiently testing devices. In particular, the preferred embodiment of the present invention provides a method and apparatus for testing ICs that allows for testing and handling of ICs to proceed substantially in parallel.

In the preferred embodiment of the present invention, a dual site loadboard tester is provided. A dual site loadboard provides dual test sites. Standard switching circuits connect the dual test sites to the pin cards in the test head.

The preferred embodiment of the present invention allows for the following method of operation. During testing of a first IC loaded into a first test site, a second IC can be loaded into a second test site. After testing of the first IC is completed, the second IC can be tested using the same set of pin cards in the test head. As a result, testing and handling of ICs can proceed substantially in parallel. Thus, ICs can be tested without having to incur all of the prohibitive costs in delay associated with handling devices between tests.

Therefore, the present invention allows relatively high pin count devices to be tested more efficiently by testing and handling devices substantially in parallel. Moreover, the present invention maximizes use of a tester without requiring additional complex and expensive equipment.

The above and other objects, features, and advantages of the present invention will become apparent from the following detailed description and drawings.

DETAILED DESCRIPTION OF THE PREFERRED EMBODIMENT

The present invention provides a method and apparatus for economically and efficiently testing devices. In particular, the preferred embodiment of the present invention provides a method and apparatus for testing ICs that allows for testing and handling of ICs to proceed substantially in parallel.

In the preferred embodiment, a MCT 2010 tester as described above and a Kuwano SOP IC LT-930 Series handler are utilized. However, the preferred embodiment includes important improvements as will become apparent to those skilled in the art.

Figure 1:
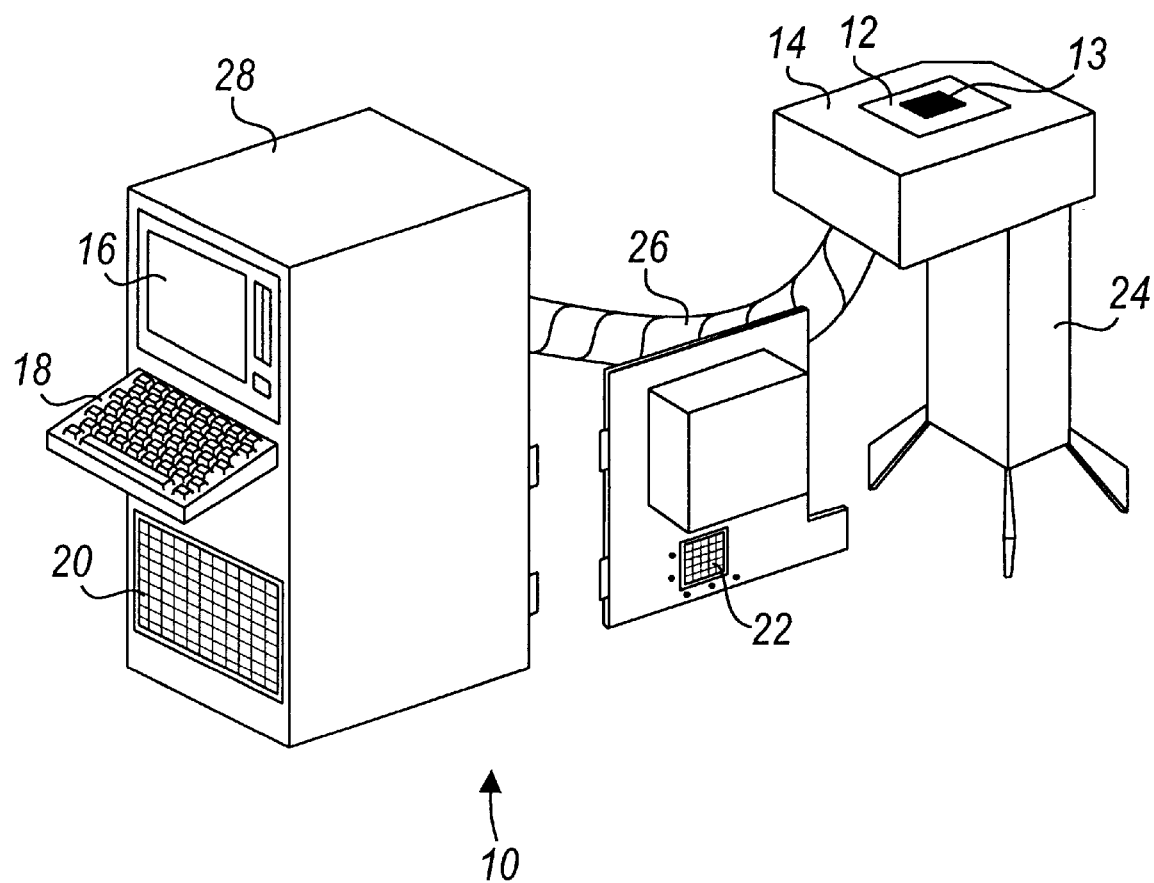
FIG. 1 is a perspective view of a prior art device testing station.
Figure 2:
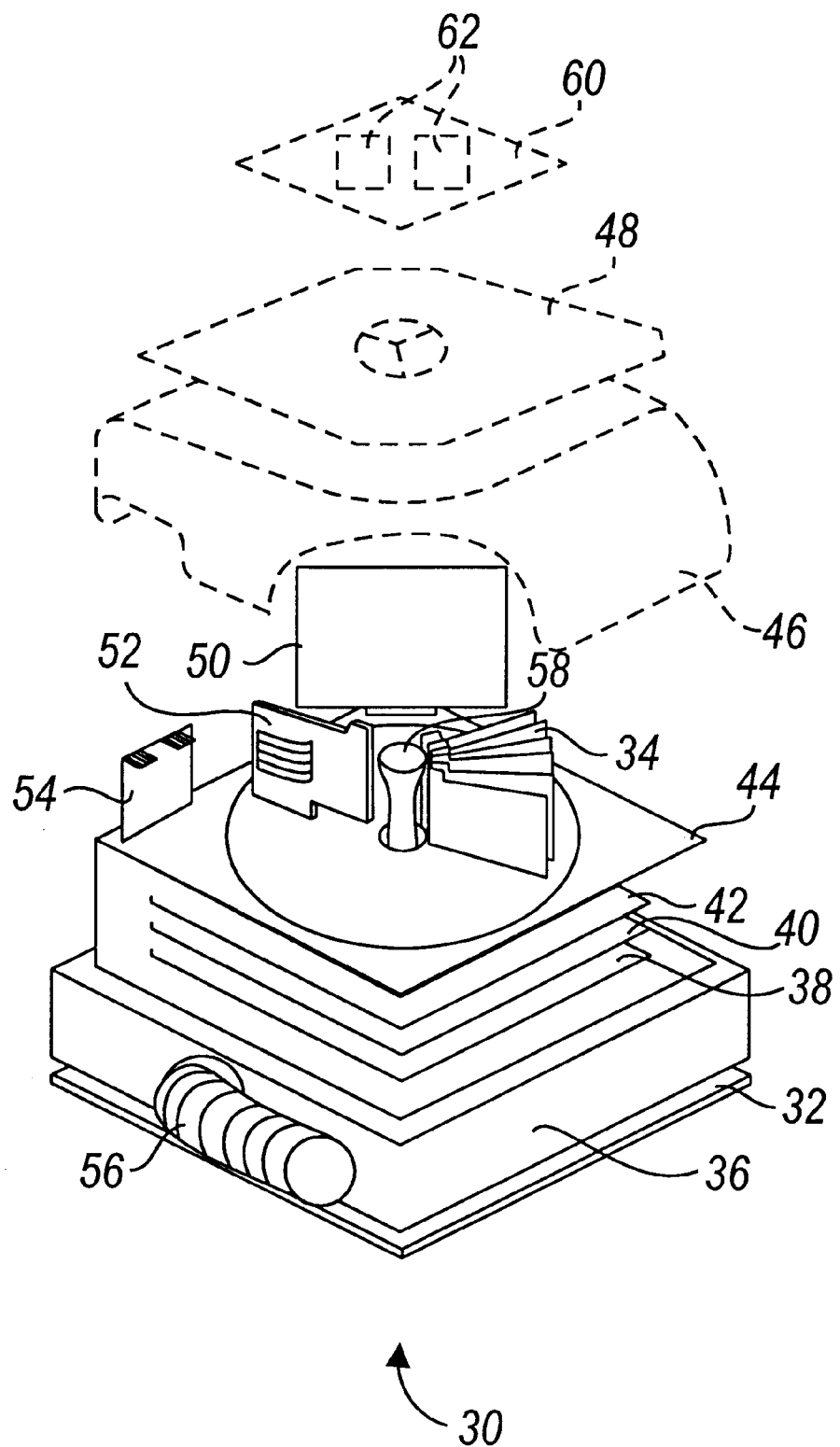
FIG. 2 is a diagram of a testing apparatus according to the present invention.

FIG. 2 provides a diagram of a testing apparatus according to the present invention. In FIG. 2, a test head 30 includes a top cover 48, a shroud 46, an air deflector 50, a hose assembly 56, a bottom plate 32, and a frame 36. Test head 30 also includes four large boards containing electronics for use in operating the testing apparatus. A motherboard 44 is the uppermost of the four large boards in test head 30. The three other large boards in test head 30 are a timing generator 42, an AC measurement unit 40, and a functional sequencer 38.

Motherboard 44 acts as a bus for test head signals and supports up to 64 pin cards 34 in their correct radial alignment. Pin cards 34, along with an auxiliary power supply board 52, a reference generator 50, and a motherboard interface board 54, plug into motherboard 44.

Motherboard interface board 54 transfers data and address signals between the controller and test head 30. Test programs running in the controller transfer data via motherboard interface board 54 by executing reads and writes to test head 30.

The reference generator 50 provides accurate reference voltages used for calibration, dynamic functional testing, AC parametric testing, and for setting the output voltage of the auxiliary power supplies on the auxiliary power supply board 52. These voltages are available to each pin card 34 and the auxiliary power supply board 52 on the motherboard 44. Except for the calibration voltages, all reference voltages are programmable.

Up to 64 pin cards 34 are located in the test head 30. Each pin of the device under test connects to one of the pin cards 34. Pin cards generally perform two basic functions: DC parametric force/measure, and functional drive/compare.

In the preferred embodiment, dual site loadboard 60 interfaces with test head 30. Dual site loadboard 60 provides dual test sites (dual sites) 62 for testing ICs with up to 64 pins. Dual sites 62 are connected to motherboard 44. Motherboard 44 includes standard switching circuits for switching electrical connection between dual sites 62. In particular, each of the pin cards is connected to each of the dual sites through a relay switch. Standard programming can be used to switch testing between dual sites 62. As a result, the dual site loadboard tester can test ICs one at a time using the same set of pin cards.

Figure 3:
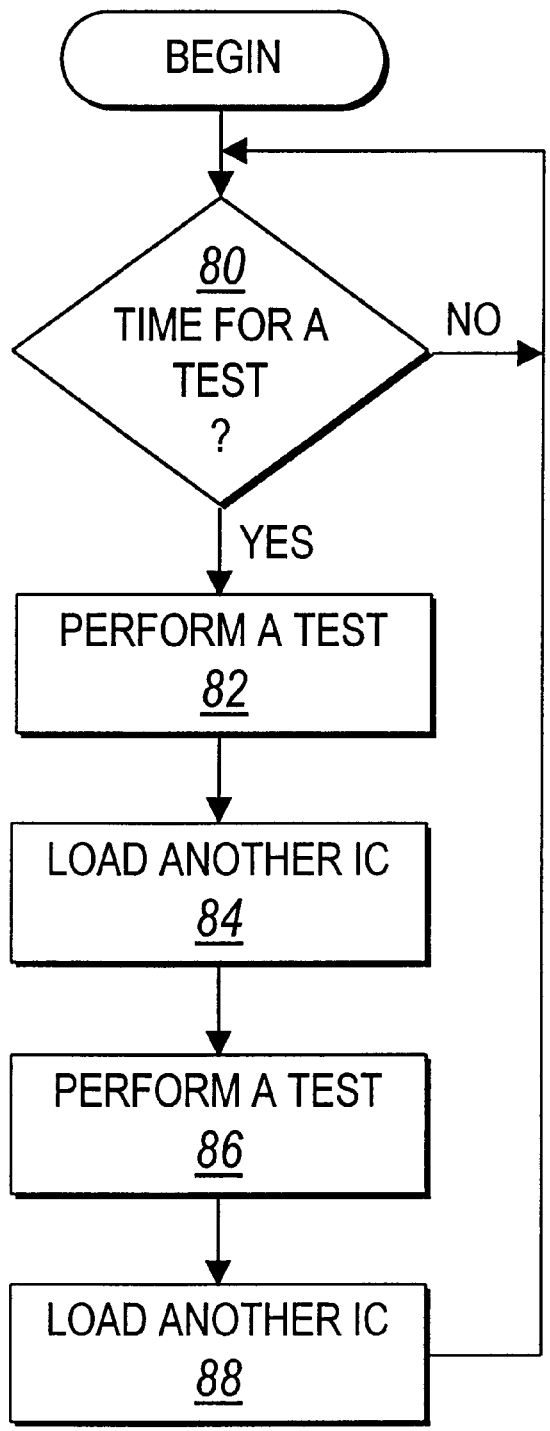
FIG. 3 is flowchart illustrating a testing method according the present invention.

FIG. 3 provides a high level flowchart illustrating a testing method according to the present invention. It will be appreciated by those skilled in the art that the net effect of the described technique is to provide an efficient method of testing devices.

Referring to FIG. 3, a check is made in the controller software to see if it is time to perform a test on an IC 80. This may be done using a timing loop or scheduled interrupts as known in the art. If it is time to perform a test on an IC then the dual site loadboard tester begins testing a first IC loaded in a first site of the dual site loadboard 82. While the first site is in test mode, another IC is prepared for testing by loading a second IC in a second site of the dual site loadboard 84. Thus, the testing of the first IC and the handling of the second IC proceed substantially in parallel. Upon completion of testing of the first IC, the second IC is tested using the same set of pin cards in the test head 86. Moreover, while the second site is in test mode, another IC can be loaded into the first site 88.

Figures 4A, 4B:
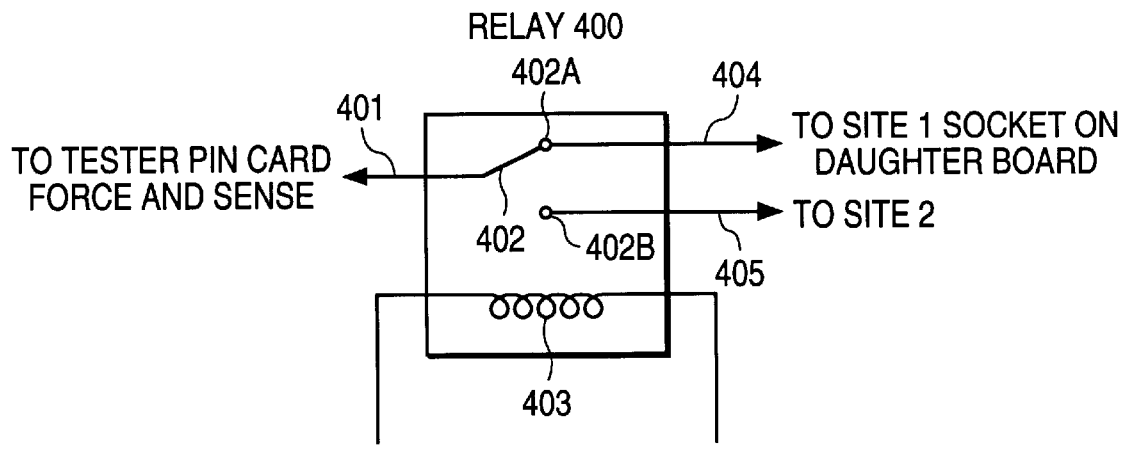
FIGS. 4A and 4B show the prior art connection between the tester pin card and site 1 socket and the dual site switching relay for switching between a given pin on one device under test ("DUT") and the same pin on another DUT of the same type, respectively.

FIG. 4A shows the prior art direct connection between a particular pin on a socket containing the device under test (DUT) at site 1 and the tester pin card force and sense electronics card. Of importance, the connection between the socket pin and the tester and pin card is direct and not switchable.

FIG. 4B shows the relay used in accordance with this invention to allow the same tester pin card to be used to test first a device contained in a socket at site 1 and secondly a device of the same type contained in a socket at site 2. Thus as shown in FIG. 4B, the tester pin card contains electronic circuitry for forcing a signal onto lead 401 and veer relay switch 402 to node 402A connected to lead 404 connected to a given pin on a socket at site 1 on a daughterboard. The signal that is sent over lead 404 from the test and pin card is also sensed to determine whether or not the particular function connected to the pin on the device under test in the socket at site 1 on the daughterboard is properly functioning. The sense structure on the tester pin card and the forcing circuitry to drive the signal on lead 401 to the device under test are all well known and are not part of this invention. Upon completion of the test on the device in the socket at site 1, relay 400 is driven by an electrical current through coil 403 to move switch arm 402 from contact with node 402A to contact node 402B. Node 402B is connected to lead 405 which is connected to a pin on a socket containing a second DUT on another daughterboard at site 2. The same test is then run on the DUT in the socket at site 2 as was run on the DUT in the socket at site 1. Upon completion of this test, the relay 400 is switched such that the contact arm 402 moves from contacting node 402B to contacting node 402A. This switching occurs under the control of software which is capable of being implemented by one of ordinary skill in the art given the disclosure of this application. During the testing of the DUT in the socket at site 2, the DUT previously tested in the socket at site 1 was removed from the socket and replaced with an additional DUT to be tested. Likewise during the testing of the DUT at site 1, the DUT previously tested in the socket at site 2 is removed from that socket and replaced with a new DUT to be tested in the socket at site 2.

The described method and apparatus provide an efficient and economical technique for efficiently testing devices such as relatively high pin count ICs. For example, dual site testing allows a first IC to be tested while a second IC is being loaded. After completion of testing of the first IC, the second IC can be tested. Thus, the described method and apparatus allows ICs to be tested without having to incur all of the prohibitive costs in delay associated with handling ICs between tests.

Moreover, the present invention allows relatively high pin count devices to be tested more efficiently by allowing testing and handling of the devices to be performed substantially in parallel. As a result, the present invention maximizes use of a tester without requiring additional complex and expensive equipment. For example, dual site testing results in a 70% to 100% increase in testing capacity as compared to single site testing performed with a MCT 2010 tester and Kuwano SOP IC LT-930 Series handler. In addition, the technique of the present invention can easily be adapted to operate with many different types of equipment other than the MCT and Kuwano equipment described above.

The above description of the present invention is illustrative and not limiting. Other embodiments of this invention will be apparent to one of ordinary skill in the art in light of the above disclosure. Accordingly, the scope of the present invention should be determined by the claims which follow.

What is claimed is:

1. An apparatus for testing devices, the apparatus comprising:
   a test apparatus comprising a plurality of test instruments;
   a loadboard comprising a plurality of test sites for holding devices;
   a switching means for connecting the test instruments to the test sites; and
   a control means for controlling the switching means so that
      the test instruments are connected to the test sites that are in test mode, whereby the testing of devices in the test sites that are in test mode and the handling of devices in the test sites that are not in test mode can proceed substantially in parallel.

2. The apparatus of claim 1, wherein at most one test site is in test mode at a time, whereby the testing of a device in the test site that is in test mode and the handling of devices in the remaining test sites can proceed substantially in parallel.

3. The apparatus of claim 1, wherein the test instruments comprise a plurality of instruments for testing integrated circuits.

4. The apparatus of claim 1, wherein the test instruments comprise a plurality of instruments for performing electrical parameter tests.

5. An apparatus for testing integrated circuit devices, the apparatus comprising:
   a test apparatus comprising a plurality of test instruments;
   a loadboard comprising at least two test sites for holding integrated circuit devices to be tested by the test apparatus, wherein the test sites are connected to the test apparatus; and
   a controller for placing at most one test site in test mode at a time.

6. The apparatus of claim 5, wherein the controller controls switching circuits so that the test site that is in test mode is connected to the test instruments, whereby the testing of an integrated circuit device in one of the test sites and the handling of integrated circuit devices in the remaining test sites can proceed substantially in parallel.

7. The apparatus of claim 5, wherein the test instruments comprise a plurality of instruments for electrical parameter testing of integrated circuits.

8. A method for testing integrated circuit devices, the method comprising the steps of:
   providing a loadboard tester comprising multiple test sites;
   loading a first set of integrated circuit devices in a first set of test sites;
   connecting test instruments to the first set of test sites holding the first set of integrated circuit devices;
   testing the first set of integrated circuit devices;
   loading a second set of integrated circuit devices in a second set of test sites during testing of the first set of integrated circuit devices, whereby the testing of the first set of integrated circuit devices and the handling of the second set of integrated circuit devices proceeds substantially in parallel;
   switching connection of the test instruments to the second set of test sites holding the second set of integrated circuit devices; and
   testing the second set of integrated circuits.

9. The method of claim 8, wherein the testing of the first set of integrated circuit devices and the testing of the second set of integrated circuit devices is performed using the same set of pin cards.

10. The method of claim 9, wherein integrated circuit devices are tested one at a time.

11. The method of claim 8, wherein the testing comprises electrical parameter testing of integrated circuits.

12. The method of testing an integrated circuit in a system which is capable of holding two or more integrated circuits simultaneously which comprises:
   testing a first integrated circuit to determine its performance;
   placing a second integrated circuit of the same type of said first integrated circuit in a separate socket in said test system while said first integrated circuit is being tested;
   testing said second integrated circuit while removing the first integrated circuit from the test system and replacing the first integrated circuit with a third integrated circuit of the same type to be tested.

13. The method of claim 12 wherein said system is capable of testing a given integrated circuit while removing an integrated circuit of the same type previously tested from the system and replacing that integrated circuit with another integrated circuit of the same type to be tested upon completion of the testing of the first integrated circuit.

* * * * *